United States Patent
Saito et al.

(10) Patent No.: US 10,340,639 B2
(45) Date of Patent: Jul. 2, 2019

(54) SHIELD SHELL AND SHIELDED CONNECTOR

(71) Applicant: YAZAKI CORPORATION, Tokyo (JP)

(72) Inventors: Akihiro Saito, Shizuoka (JP); Takashi Sone, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 15/995,092

(22) Filed: May 31, 2018

(65) Prior Publication Data

US 2018/0358758 A1    Dec. 13, 2018

(30) Foreign Application Priority Data

Jun. 12, 2017    (JP) .................................. 2017-114914

(51) Int. Cl.

| | | |
|---|---|---|
| H01R 13/6593 | (2011.01) | |
| H05K 9/00 | (2006.01) | |
| H01R 13/74 | (2006.01) | |
| H01R 13/502 | (2006.01) | |
| B60R 16/02 | (2006.01) | |
| H01R 9/05 | (2006.01) | |
| H01R 13/6592 | (2011.01) | |
| H02G 3/06 | (2006.01) | |
| H02G 15/06 | (2006.01) | |
| H01R 13/6582 | (2011.01) | |

(52) U.S. Cl.
CPC ..... *H01R 13/6593* (2013.01); *B60R 16/0215* (2013.01); *H01R 9/0518* (2013.01); *H01R 13/502* (2013.01); *H01R 13/6592* (2013.01); *H02G 3/0666* (2013.01); *H02G 15/06* (2013.01); *H05K 9/0007* (2013.01); *H01R 13/6582* (2013.01); *H01R 13/74* (2013.01)

(58) Field of Classification Search
CPC ............ H01R 12/6593; H01R 12/6592; H01R 12/6585; H01R 12/6581; H01R 12/642
See application file for complete search history.

(56) References Cited

U.S. PATENT DOCUMENTS

| | | | | |
|---|---|---|---|---|
| 7,331,823 | B2 * | 2/2008 | Fukushima | ............ H01R 9/032 |
| | | | | 439/607.46 |
| 9,806,454 | B2 * | 10/2017 | Nakai | ................ H01R 13/6581 |
| 9,843,139 | B2 * | 12/2017 | Ohkubo | ............. H01R 13/6581 |
| 2014/0308847 | A1 * | 10/2014 | Tanaka | ............... H01R 13/6593 |
| | | | | 439/607.41 |

FOREIGN PATENT DOCUMENTS

JP          2015-76380 A      4/2015

* cited by examiner

*Primary Examiner* — Briggitte R. Hammond
(74) *Attorney, Agent, or Firm* — Kenealy Vaidya LLP

(57) ABSTRACT

A shielded connector includes a shield shell and a shield member. The shield shell includes a shield member mounting portion on which the shield member is mounted by fastening of a binding member. The shield member mounting portion includes a fastening position aligning unit on an outer surface thereof. The fastening position aligning unit includes an inclined portion and a binding member movement restricting portion. The inclined portion is inclined in a tapered shape from a base end side of the shield member mounting portion toward an open end side. The binding member movement restricting portion restricts the binding member from moving toward the open end side of the shield member mounting portion.

6 Claims, 4 Drawing Sheets

SHIELD SHELL AND SHIELDED CONNECTOR

CROSS REFERENCE TO RELATED APPLICATIONS

This application is based on Japanese Patent Application (No. 2017-114914) filed on Jun. 12, 2017, the contents of which are incorporated herein by reference.

BACKGROUND OF THE INVENTION

1. Field of the Invention

The present invention relates to a shield shell on which a shield member is mounted, and a shielded connector including the shield shell.

2. Description of the Related Art

In the related art, as a technique relating to the shield shell and the shielded connector, for example, a technique disclosed in JP-A-2015-76380 is known.

A shielded connector 10 illustrated in FIGS. 1 to 4 of JP-A-2015-76380 is connected and fixed to a connection portion 3 provided in a case 2 of a unit 1 that is one of various devices such as a motor or an inverter. The shielded connector 10 includes: a shield shell 26; a housing 21 that is held in the shield shell 26; an electric wire 11 that has an end connected to a terminal 22 and is inserted into the housing 21; and a braid 12 (so-called a shield member) that is mounted on the shield shell 26 by fastening of an annular member 61 (so-called a binding member).

The mounting of the braid 12 on the shield shell 26 is performed by covering a braid mounting portion 42 of the shield shell 26 with an end of the braid 12 and fastening an outer periphery of the end of the braid 12 using the annular member 61.

However, in a shield shell of the related art, an outer surface of a shield member mounting portion (corresponding to the braid mounting portion 42 in JP-A-2015-76380) is formed substantially parallel to an axial direction of the shield member mounting portion. In addition, the shield shell of the related art does not have a configuration for aligning a fastening position of a binding member (corresponding to the annular member 61 in JP-A-2015-76380). Therefore, it is not easy to fasten the binding member to an appropriate fastening position, and there is a problem in that the binding member cannot be reliably fastened to the fastening position.

In addition, as described above, the shield shell of the related art does not have the configuration for aligning the fastening position of the binding member. Therefore, in a case where a shield member (corresponding to the braid 12 in JP-A-2015-76380) is pulled toward an open end side of the shield member mounting portion, there is a problem in that the binding member may be removed from the shield member mounting portion.

SUMMARY OF THE INVENTION

The present invention has been made in consideration of the above-described circumstances, and an object thereof is to provide a shield shell in which a binding member can be easily and reliably fastened to a fastening position in a case where a shield member is mounted on the shield shell, and a shielded connector including the shield shell.

The above-described object of the present disclosure is achieved by below-described structures.

(1) A shield shell including:

a housing accommodation portion that includes a shell fixing portion configured to be fixed to a conductive mounting target and that is configured to accommodate a housing; and a shield member mounting portion that is formed so as to be continuous to the housing accommodation portion and that has an outer surface on which a shield member is mounted by fastening of a binding member, wherein a fastening position aligning unit is provided on an entire circumference or at a plurality of positions of the outer surface of the shield member mounting portion;

wherein the fastening position aligning unit includes an inclined portion and a restricting portion;

wherein the inclined portion is inclined in a tapered shape from a base end side of the shield member mounting portion toward an open end side of the shield member mounting portion; and wherein the restricting portion is continuous to a lowest portion of the inclined portion and restricts the binding member from moving toward the open end side of the shield member mounting portion when the shield member is pulled toward the open end side of the shield member mounting portion.

(2) The shield shell according to the item (1), wherein the shield member mounting portion is formed such that a cross-section taken along a direction perpendicular to an axial direction of the shield member mounting portion has an elliptical shape or an oval shape; and wherein in a case where the fastening position aligning unit is provided at a plurality of positions in the outer surface of the shield member mounting portion, the fastening position aligning units are disposed to face long side portions of the shield member mounting portion.

(3) The shield shell according to the item (1) or (2), wherein the restricting portion is formed at a height that is substantially equal to or greater than sum of a height of the shield member and a height of the binding member in a thickness direction when the shield member is mounted on the shield member mounting portion by fastening of the binding member.

(4) The shield shell according to any one of the items (1) to (3), wherein a portion where the restricting portion is continuous to the outer surface of the shield member mounting portion is formed in a curved shape in cross-section.

(5) A shielded connector including:

the shield shell according to any one of the items (1) to (4);

the housing that is accommodated in the shield shell;

a conduction path with a terminal that is accommodated in the housing; and the shield member that is mounted on the outer surface of the shield member mounting portion of the shield shell by fastening of the binding member According to the above-described features, in a case where the shield member is mounted on the shield member mounting portion, by fastening the binding member while pulling the shield shell or the shield member up to the fastening position of the binding member, the binding member comes into contact with the restricting portion through the shield member. As a result, it can be easily recognized that the binding member and the shield member are reliably disposed at the fastening position. Therefore, the alignment of the fastening position of the binding member can be reliably and easily performed.

In addition, the binding member comes into contact with the restricting portion through the shield member. Therefore, even in a case where the shield member is pulled toward the open end side of the shield member mounting portion, the movement of the binding member toward the open end side is restricted. As a result, the binding member is prevented from being removed from the shield member mounting portion.

Further, the inclined portion is formed to be inclined in a tapered shape from the base end side of the shield member mounting portion toward the open end side of the shield member mounting portion. As a result, the binding member can be easily guided up to the fastening position. In addition, in the inclined portion, the outer diameter of the base end side is larger than the outer diameter of the open end side. Therefore, the movement of the binding member toward the base end side is restricted even in a case where vibration or the like is applied thereto. As a result, the fastening of the binding member is not released.

According to the above-described characteristics, the fastening position aligning units are disposed to face the long side portions of the shield member mounting portion, and thus are provided on each of the pair of long side portions. As a result, it can be more easily recognized that the binding member and the shield member are reliably disposed at the fastening position, for example, compared to a case where the fastening position aligning unit is disposed on only the single long side portion of the shield member mounting portion. In addition, the movement of the binding member toward the base end side and the open end side is more reliably restricted.

According to the above-described characteristics, the height of the restricting portion is substantially the same as the sum of the height of the shield member and the height of the binding member in the thickness direction, or is higher than the sum of the height of the shield member and the height of the binding member in the thickness direction. Therefore, the binding member reliably comes into contact with the restricting portion through the shield member.

According to the above-described characteristics, the portion where the restricting portion is formed to be continuous to the outer surface of the shield member mounting portion is formed in a curved shape in cross-section. Therefore, even in a case where continuous portion contacts with the shield member, the shield member is not likely to be damaged.

According to the above-described characteristics, the shielded connector is a shielded connector including the shield shell according to the items (1) to (4).

According to the invention, in a case where the shield member is mounted, an effect of easily and reliably fastening the binding member to the fastening position is exhibited.

BRIEF DESCRIPTION OF THE DRAWINGS

FIGS. 1A and 1B are views illustrating an embodiment of a shielded connector according to the present invention, in which FIG. 1A is a side view illustrating the shielded connector and FIG. 1B is an enlarged view illustrating a portion indicated by arrow A in FIG. 1A;

FIGS. 3A and 3B are views illustrating the shield shell, in which FIG. 3A is a plan view illustrating the shield shell and FIG. 3B is a side view illustrating the shield shell.

DETAILED DESCRIPTION OF THE EXEMPLARY EMBODIMENTS

Hereinafter, an embodiment of a shield shell and a shielded connector according to the present invention will be described with reference to FIGS. 1A to 3B.

Figure 1A:
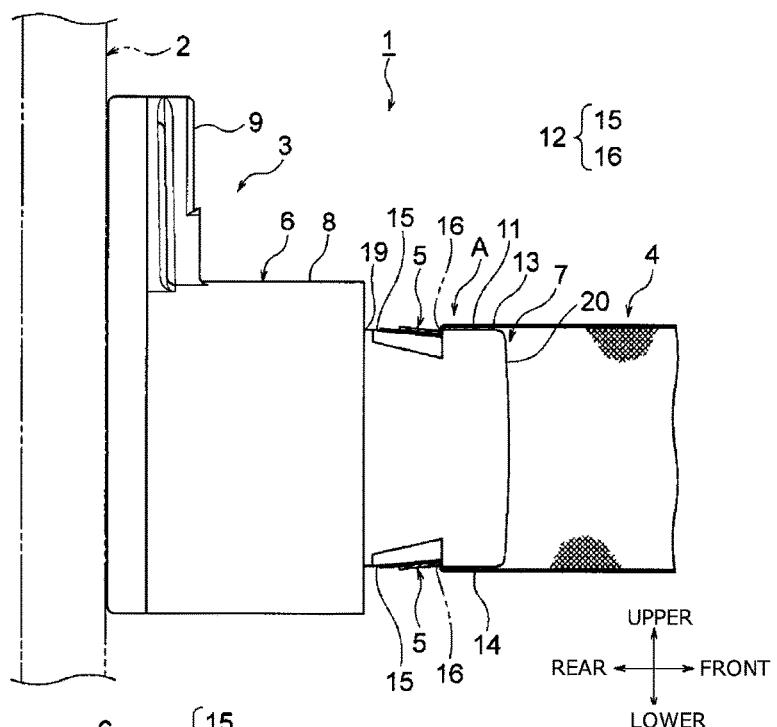
Figure 1B:
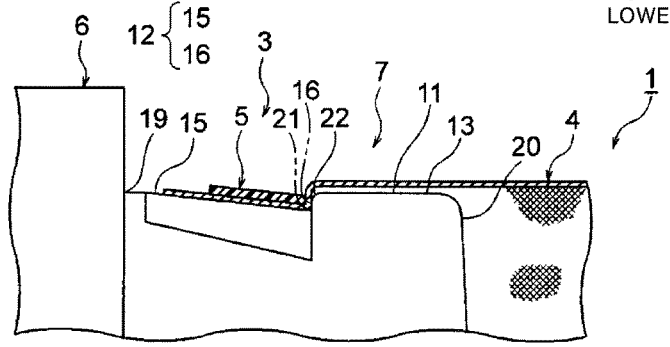
Figure 2:
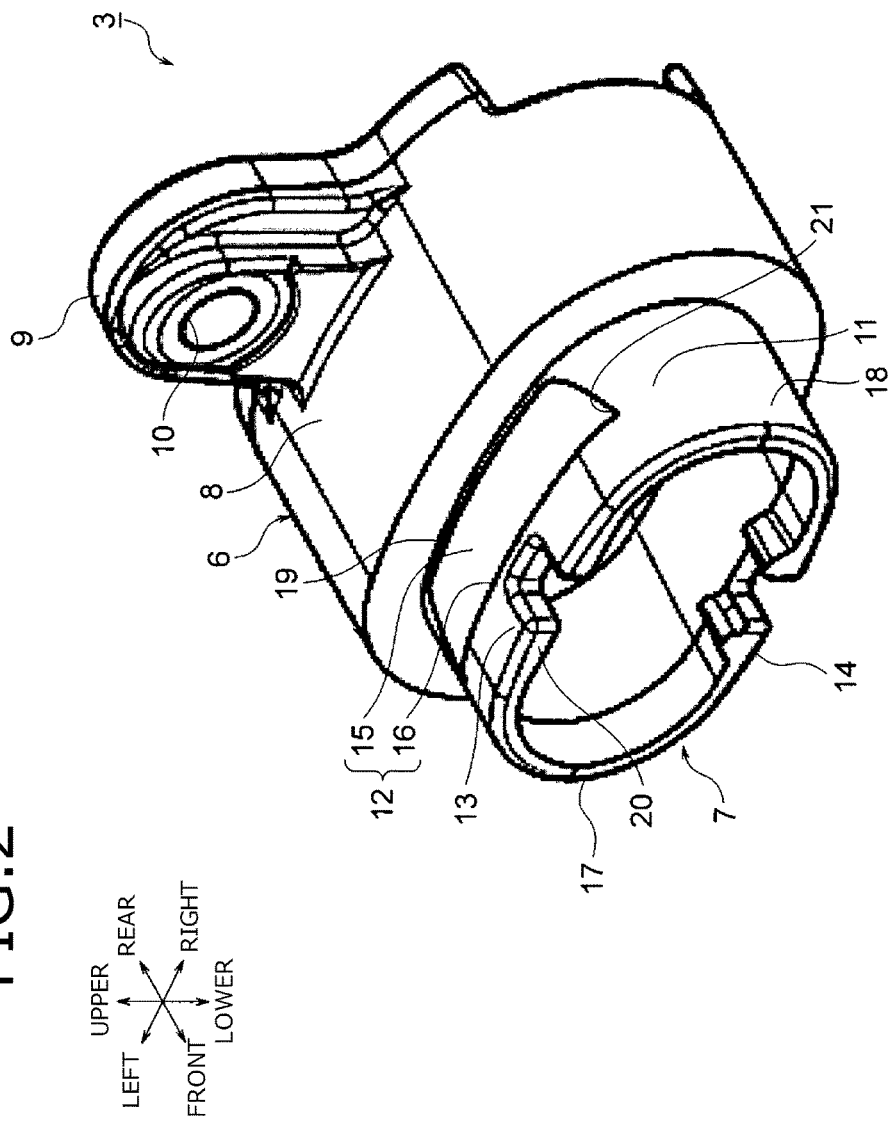
FIG. 2 is a perspective view illustrating an embodiment of a shield shell according to the present invention.
Figure 3A:
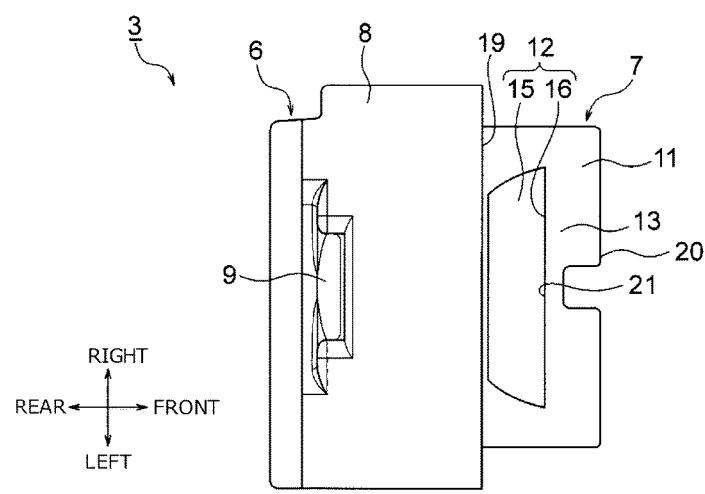
Figure 3B:
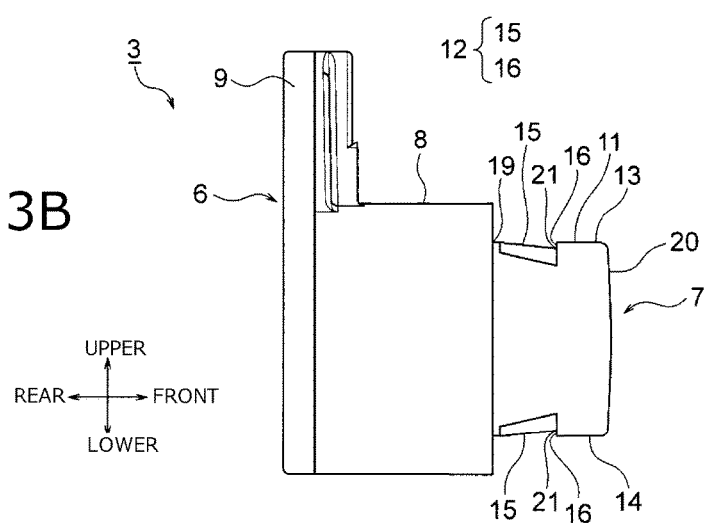

FIGS. 1A and 1B are views illustrating an embodiment of a shielded connector according to the present invention, in which FIG. 1A is a side view illustrating the shielded connector and FIG. 1B is an enlarged view illustrating a portion indicated by arrow A in FIG. 1A. FIG. 2 is a perspective view illustrating an embodiment of a shield shell according to the present invention. FIGS. 3A and 3B are views illustrating the shield shell, in which FIG. 3A is a plan view illustrating the shield shell and FIG. 3B is a side view illustrating the shield shell.

In the drawings, arrows represent respective directions of upper and lower sides, right and left sides, and front and rear sides (the respective directions of the arrows are exemplary).

In FIGS. 1A and 1B, the reference numeral 1 represents the embodiment of the shielded connector according to the present invention. The shielded connector 1 is not particularly limited and is electrically connected to an electrical device such as an inverter or a motor to be mounted on an electric vehicle or a hybrid vehicle when mounted on a case 2 of the electrical device.

The case 2 corresponds to "mounting target" in the claims and is formed of a conductive metal. The case 2 is, for example, a case of an inverter unit or a motor unit, and a grounded circuit is provided in the inverter unit or the motor unit. The case 2 is a shield case connected to ground which is the grounded circuit.

As illustrated in FIGS. 1A and 1B, the shielded connector 1 includes a shield shell 3, a housing H (not illustrated), a conduction path with terminals (not illustrated), a shield member 4, and a binding member 5. Hereinafter, each configuration of the shielded connector 1 will be described.

First, the shield shell 3 will be described.

The shield shell 3 is formed of a conductive metal material, and is formed in a cylindrical shape in which a cross-section taken along a direction perpendicular to an axial direction of the shield shell 3 has an elliptical shape as illustrated in FIG. 2. The shield shell 3 includes a housing accommodation portion 6 and a shield member mounting portion 7.

As illustrated in FIG. 2, the housing accommodation portion 6 is formed in a cylindrical shape in which a cross-section taken along a direction perpendicular to an axial direction of the housing accommodation portion 6 has an elliptical shape, and is formed such that the housing (not illustrated) can be accommodated therein. A shell fixing portion 9 is formed on an outer surface 8 of the housing accommodation portion 6. The shell fixing portion 9 is formed so as to protrude from an end (in FIG. 2, a rear end in a front-rear direction) of the outer surface 8 of the housing accommodation portion 6 that is in surface contact with the case 2. A bolt insertion hole 10 is formed in the shell fixing portion 9. The bolt insertion hole 10 is formed so as to allow insertion of a bolt (not illustrated).

As illustrated in FIG. 2, the shield member mounting portion 7 is formed to be continuous to a front end of the housing accommodation portion 6. The shield member mounting portion 7 is formed in a cylindrical shape in which a cross-section taken along a direction perpendicular to an axial direction of the shield member mounting portion 7 has an elliptical shape. A fastening position aligning unit 12 is formed on an outer surface 11 of the shield member mounting portion 7.

In the embodiment, the shield member mounting portion 7 is formed in the above-described shape but is not limited thereto. In addition, the shield member mounting portion 7 may be formed in a cylindrical shape in which a cross-section taken along a direction perpendicular to an axial direction of the shield member mounting portion 7 has an oval shape.

As illustrated in FIG. 3B, in the embodiment, a plurality of (in the embodiment, two) fastening position aligning units 12 are formed. The fastening position aligning units 12 are formed to face long side portions 13 and 14 of the outer surface 11 of the shield member mounting portion 7. As illustrated in FIGS. 2 and 3A, the fastening position aligning unit 12 is formed so as to extend in a direction (in FIG. 2, the right-left direction) perpendicular to the axial direction of the shield member mounting portion 7.

The number of fastening position aligning units 12 disposed is not limited to the embodiment. In addition, for example, in addition to the configuration of the embodiment illustrated in FIGS. 1A to 3B, a configuration may also be adopted in which the fastening position aligning units 12 are disposed to face short side portions 17 and 18 of the outer surface 11 of the shield member mounting portion 7.

In addition, the configuration of the fastening position aligning unit 12 is not limited to the above-described configuration in which a plurality of fastening position aligning units 12 are formed. In addition, although not particularly illustrated in the drawing, a configuration in which the fastening position aligning unit 12 is formed over the entire circumference of the outer surface 11 of the shield member mounting portion 7 may be adopted.

As illustrated in FIGS. 1A to 3B, the fastening position aligning unit 12 includes an inclined portion 15 and a binding member movement restricting portion 16.

As illustrated in FIGS. 1A to 3B, the inclined portion 15 is as an inclined surface that is inclined in a tapered shape from a base end 19 side of the shield member mounting portion 7 toward an open end 20 side of the shield member mounting portion 7. Here, the base end 19 corresponds to an end (in FIGS. 1A to 3B, a rear end in the front-rear direction) of the shield member mounting portion 7 continuous to a front end of the housing accommodation portion 6. Here, the open end 20 corresponds to an end (in FIGS. 1A to 3B, a front end in the front-rear direction) of the shield member mounting portion 7 opposite to the end continuous to the front end of the housing accommodation portion 6.

By forming the inclined portion 15 in the above-described shape, as illustrated in FIGS. 1A to 3B, the outer diameter of the inclined portion 15 gradually decreases from the base end 19 side toward the open end 20 side of the shield member mounting portion 7. In the inclined portion 15, a position where the outer diameter is the minimum as illustrated in FIGS. 1A to 3B will be referred to as a "lowest portion 21".

As illustrated in FIGS. 1A to 3B, the inclined portion 15 is formed in a flat shape, and the surface thereof is treated to improve lubricating properties.

As illustrated in FIGS. 1A to 3B, the binding member movement restricting portion 16 is formed as a wall portion that is continuous to the lowest portion 21 of the inclined portion 15 and rises in a direction perpendicular to the axial direction of the shield member mounting portion 7. As described in detail below, the binding member movement restricting portion 16 is formed to restrict the binding member 5 from moving toward the open end 20 side of the shield member mounting portion 7 in a case where the shield member 4 is pulled toward the open end 20 side of the shield member mounting portion 7.

As illustrated in FIGS. 1A and 1B, the binding member movement restricting portion 16 is formed at a height that is higher than the height of the shield member 4 and the binding member 5 in the thickness direction in a case where the shield member 4 is mounted on the shield member mounting portion 7 by fastening of the binding member 5.

By setting the height of the binding member movement restricting portion 16 as described above, an end of the binding member 5 comes into contact with the binding member movement restricting portion 16 through the shield member 4 even in a case where the binding member 5 moves toward the open end 20 side of the shield member mounting portion 7 when the shield member 4 is pulled toward the open end 20 side of the shield member mounting portion 7. As a result, the binding member movement restricting portion 16 restricts the binding member 5 from moving toward the open end 20 side.

The height of the binding member movement restricting portion 16 may be set such that the end of the binding member 5 can come into contact with the binding member movement restricting portion 16 through the shield member 4 even in a case where the binding member 5 moves toward the open end 20 side of the shield member mounting portion 7. Accordingly, the binding member movement restricting portion 16 may be formed at a height that is substantially the same as the height of the shield member 4 and the binding member 5 in the thickness direction in a case where the shield member 4 is mounted on the shield member mounting portion 7 by fastening of the binding member 5.

As illustrated in FIG. 1B, a portion where the binding member movement restricting portion 16 is formed to be continuous to the outer surface 11 of the shield member mounting portion 7 is formed as a curved portion 22. The curved portion 22 is formed in a curved shape in cross-section. By forming the curved portion 22 in the above-described shape, the shield member 4 is not likely to be damaged even when contacting with the shield member 4 illustrated in FIG. 1B.

Next, the housing will be described.

Although not particularly illustrated in the drawing, the housing is formed of an insulating synthetic resin material, and is formed so as to be accommodated in the housing accommodation portion 6 of the shield shell 3. The housing is formed such that the conduction path with terminals (not illustrated) can be accommodated therein.

Next, the conduction path with terminals will be described.

Although not particularly illustrated in the drawing, in the conduction path with terminals, terminal fittings are connected to the terminals of the conduction path (for example, an electric wire or a cable).

Next, the shield member 4 will be described.

As illustrated in FIGS. 1A and 1B, the shield member 4 is a cylindrical member for shielding electromagnetism (shield member for a countermeasure against electromagnetic waves), and is formed in a shape in which the shield member 4 can cover over the entire length of a conduction path constituting the conduction path with terminals. In the embodiment, the shield member 4 is a braid that is formed by braiding conductive extra-thin wires in a cylindrical shape.

In the embodiment, as described above, a braid is adopted as the shield member 4. However, the shield member 4 is not limited to a braid as long as it can take the countermeasure against electromagnetic waves. In addition, for example, a conductive metal foil or a member including the metal foil may be adopted.

Next, the binding member 5 will be described.

As illustrated in FIGS. 1A and 1B, the binding member 5 is a member for fastening the shield member 4 covering the shield member mounting portion 7. Specific examples of the binding member 5 include Ty-Rap (registered trade name, manufactured by Thomas&Betts), INSULOK (registered trade name, manufactured by HellermannTyton Co., Ltd.), and the like. As the binding member 5, in addition to the above-described examples, a crimp ring may be adopted.

Next, the procedure of an assembly operation of the shielded connector 1 will be described.

First, although not illustrated in the drawing, the conduction path with terminals is accommodated in the housing. Next, the housing is accommodated in the housing accommodation portion 6 of the shield shell 3 illustrated in FIGS. 2 to 3B.

Next, the shield member mounting portion 7 is covered with the shield member 4, and the outer side of the shield member 4 covering the shield member mounting portion 7 is fastened by the binding member 5. At this time, the binding member 5 is fastened to the position of the inclined portion 15 of the fastening position aligning unit 12.

Next, a fastening operation of the binding member 5 is performed while pulling the shield member 4 toward the open end 20 side of the shield member mounting portion 7. In this way, as illustrated in FIGS. 1A and 1B, the end of the binding member 5 comes into contact with the binding member movement restricting portion 16 through the shield member 4. As a result, the binding member 5 and the shield member 4 are disposed at the fastening position. In this way, the fastening operation of the binding member 5 is completed, and the assembly operation of the shielded connector 1 is completed.

Next, the procedure of a mounting operation of the shielded connector 1 on the case 2 will be described.

First, a part of the shielded connector 1 illustrated in FIGS. 1A and 1B is inserted into an insertion port (not illustrated) formed in the case 2, and a rear end of the shield shell 3 comes into surface contact with the case 2. Next, a bolt (not illustrated) is inserted into the bolt insertion hole 10 (refer to FIG. 2) of the shell fixing portion 9, and this bolt is screwed into a bolt screw hole (not illustrated) formed in the case 2. As a result, the shielded connector 1 is fixed to the case 2. In this way, the mounting operation of the shielded connector 1 on the case 2 is completed.

Figure 4:
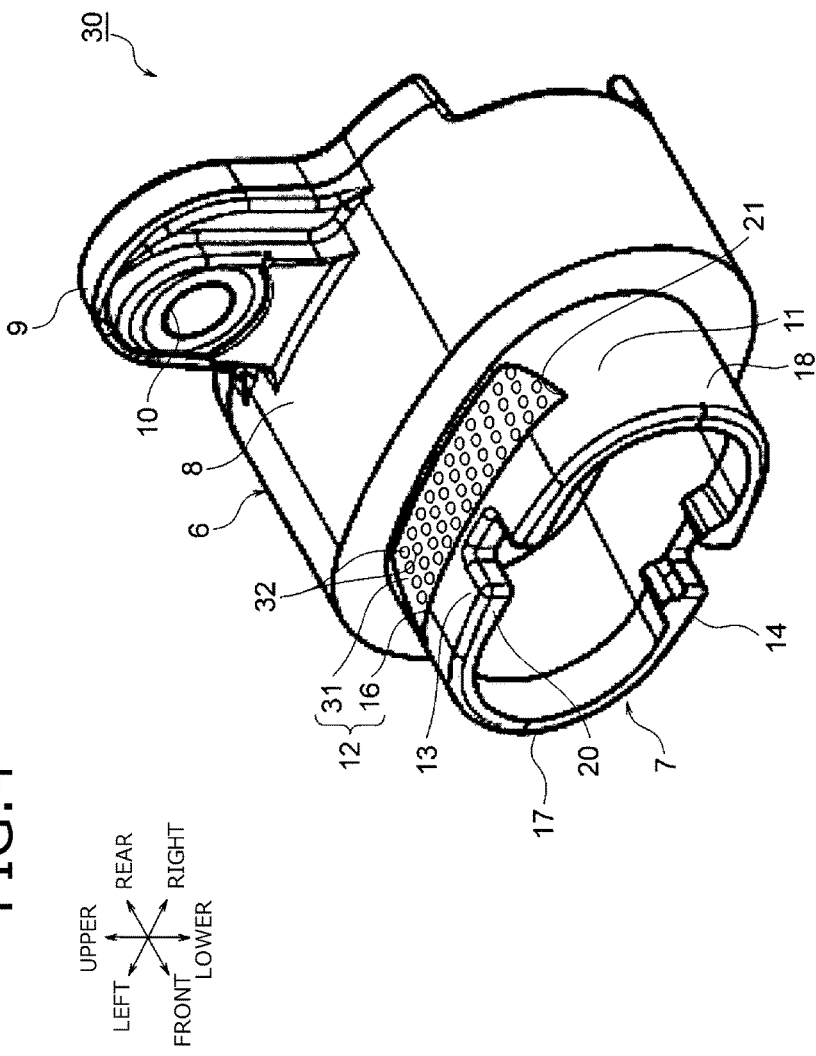
FIG. 4 is a perspective view illustrating a modification example of the shield shell.

The shield shell 3 according to the above-described embodiment may be replaced with a modification example illustrated in FIG. 4. Hereinafter, the modification example will be described with reference to FIG. 4. FIG. 4 is a perspective view illustrating the modification example of the shield shell.

In a shield shell 30 illustrated in FIG. 4, a plurality of protrusion portions 32 are formed in the inclined portion 31. The protrusion portions 32 are formed in a dimpled shape as illustrated in FIG. 4. By forming the protrusion portions 32, the inclined portion 31 is formed in a shape in which unevenness is imparted to the surface. As a result, a frictional resistance of the surface of the inclined portion 31 increases, and thus the fastening of the binding member 5 is not likely to be released even when vibration or the like is applied thereto.

Instead of the shield shell 30 according to the modification example, a shield shell in which the surface of the inclined portion 15 illustrated in FIG. 2 is "rough" without being treated may be adopted.

Next, an effect of the shield shells 3 and 30 and the shielded connector 1 will be described.

As described above with reference to FIGS. 1A to 4, in the shield shell 3 or 30, in a case where the shield member 4 is mounted on the shield member mounting portion 7, by fastening the binding member 5 while pulling the shield shell 3 or 30 or the shield member 4 up to the fastening position of the binding member 5, the binding member 5 comes into contact with the binding member movement restricting portion 16 through the shield member 4. As a result, it can be easily recognized that the binding member 5 and the shield member 4 are reliably disposed at the fastening position. Therefore, the alignment of the fastening position of the binding member 5 can be reliably and easily performed. Accordingly, in a case where the shield member 4 is mounted, an effect of easily and reliably fastening the binding member 5 to the fastening position is exhibited.

In addition, in the shield shell 3 or 30, the binding member 5 comes into contact with the binding member movement restricting portion 16 through the shield member 4. Therefore, even in a case where the shield member 4 is pulled toward the open end 20 side of the shield member mounting portion 7, the movement of the binding member 5 toward the open end 20 side is restricted. As a result, the binding member 5 is prevented from being removed from the shield member mounting portion 7. Therefore, an effect of more reliably fastening the binding member 5 to the fastening position is exhibited.

In addition, in the shield shell 3 or 30, the inclined portion 15 or 31 is formed to be inclined in a tapered shape from the base end 19 side of the shield member mounting portion 7 toward the open end 20 side of the shield member mounting portion 7. As a result, the binding member 5 can be easily guided up to the fastening position. In addition, in the inclined portion 15 or 31, the outer diameter of the base end 19 side is larger than the outer diameter of the open end 20 side. Therefore, the movement of the binding member 5 toward the base end 19 side is restricted even in a case where vibration or the like is applied thereto. As a result, the fastening of the binding member 5 is not released, and thus, in a case where the shield member 4 is mounted on the shield member mounting portion 7, an effect of more easily and reliably fastening the binding member 5 to the fastening position is exhibited.

In addition, in the shield shell 3 or 30, the fastening position aligning unit 12 is disposed to face the long side portions 13 and 14 of the shield member mounting portion 7, and thus is provided on each of the pair of long side portions 13 and 14. As a result, it can be more easily recognized that the binding member 5 and the shield member 4 are reliably disposed at the fastening position, for example, compared to a case where the fastening position aligning unit 12 is disposed on only the single long side portion 13 (14) of the shield member mounting portion 7. In addition, the movement of the binding member 5 toward the base end 19 side and the open end 20 side is more reliably restricted. Accordingly, in a case where the shield member 4 is mounted, an effect of more easily and reliably fastening the binding member 5 to the fastening position is exhibited.

In addition, in the shield shell 3 or 30, the height of the binding member movement restricting portion 16 is substantially the same as the height of the shield member 4 and the binding member 5 in the thickness direction, or is higher than the height of the shield member 4 and the binding member 5 in the thickness direction. Therefore, the binding member 5 reliably comes into contact with the binding member movement restricting portion 16 through the shield member 4. Accordingly, in a case where the shield member 4 is mounted, an effect of more easily and reliably fastening the binding member 5 to the fastening position is exhibited.

In addition, in the shield shell 3 or 30, the curved portion 22 where the binding member movement restricting portion 16 is formed to be continuous to the outer surface 11 of the shield member mounting portion 7 is formed in a curved shape in cross-section. Therefore, even in a case where the curved portion 22 contacts with the shield member 4, an effect of suppressing damage to the shield member 4 is exhibited.

Further, in the shielded connector 1, the above-described shield shell 3 or 30 is adopted. Therefore, the same effects as those of the shield shell 3 or 30 are exhibited.

In addition, it is obvious that various modifications can be made within a range not departing from the scope of the present invention.

What is claimed is:

1. A shield shell comprising:
   a housing accommodation portion that includes a shell fixing portion configured to be fixed to a conductive mounting target and that is configured to accommodate a housing; and
   a shield member mounting portion that is formed so as to be continuous to the housing accommodation portion and that has an outer surface on which a shield member is mounted by fastening of a binding member,
   wherein a fastening position aligning unit is provided on an entire circumference or at a plurality of positions of the outer surface of the shield member mounting portion;
   wherein the fastening position aligning unit includes an inclined portion and a restricting portion;
   wherein the inclined portion is inclined in a tapered shape from a base end side of the shield member mounting portion toward an open end side of the shield member mounting portion; and
   wherein the restricting portion is continuous to a lowest portion of the inclined portion and restricts the binding member from moving toward the open end side of the shield member mounting portion when the shield member is pulled toward the open end side of the shield member mounting portion,
   wherein the restricting portion intersects the inclined portion at an acute angle.

2. The shield shell according to claim 1, wherein the shield member mounting portion is formed such that a cross-section taken along a direction perpendicular to an axial direction of the shield member mounting portion has an elliptical shape or an oval shape; and
   wherein in a case where the fastening position aligning unit is provided at a plurality of positions in the outer surface of the shield member mounting portion, the fastening position aligning units are disposed to face long side portions of the shield member mounting portion.

3. The shield shell according to claim 1, wherein the restricting portion is formed at a height that is substantially equal to or greater than sum of a height of the shield member and a height of the binding member in a thickness direction when the shield member is mounted on the shield member mounting portion by fastening of the binding member.

4. The shield shell according to claim 1, wherein a portion where the restricting portion is continuous to the outer surface of the shield member mounting portion is formed in a curved shape in cross-section.

5. The shield shell according to claim 1, wherein in the inclined portion, an outer diameter of the base end side of the shield member mounting portion is larger than an outer diameter of the open end side of the shield member mounting portion.

6. The shield shell according to claim 5, wherein outside of the inclined portion, an outer diameter of the base end side of the shield member mounting portion and an outer diameter of the open end side of the shield member mounting portion are equal to the outer diameter of the base end side of the shield member mounting portion in the inclined portion.

* * * * *